(12) United States Patent
Hsieh

(10) Patent No.: US 9,018,701 B2
(45) Date of Patent: Apr. 28, 2015

(54) AVALANCHE CAPABILITY IMPROVEMENT IN POWER SEMICONDUCTOR DEVICES USING THREE MASKS PROCESS

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/949,357

(22) Filed: Jul. 24, 2013

(65) Prior Publication Data

US 2014/0048872 A1 Feb. 20, 2014

Related U.S. Application Data

(63) Continuation-in-part of application No. 13/585,059, filed on Aug. 14, 2012, now Pat. No. 8,563,381.

(51) Int. Cl.
| | |
|---|---|
| H01L 29/78 | (2006.01) |
| H01L 29/66 | (2006.01) |
| H01L 29/417 | (2006.01) |
| H01L 29/739 | (2006.01) |
| H01L 29/06 | (2006.01) |
| H01L 29/10 | (2006.01) |
| H01L 29/423 | (2006.01) |
| H01L 29/45 | (2006.01) |

(52) U.S. Cl.
CPC ...... *H01L 29/7827* (2013.01); *H01L 29/66666* (2013.01); *H01L 29/41766* (2013.01); *H01L 29/4236* (2013.01); *H01L 29/456* (2013.01); *H01L 29/66727* (2013.01); *H01L 29/66734* (2013.01); *H01L 29/7397* (2013.01); *H01L 29/7808* (2013.01); *H01L 29/7813* (2013.01); *H01L 29/0626* (2013.01); *H01L 29/1095* (2013.01)

(58) Field of Classification Search
CPC .............. H01L 29/7827; H01L 29/66666; H01L 29/41766; H01L 29/66727; H01L 29/66734; H01L 29/7397; H01L 29/1095; H01L 29/0626
USPC .............................................. 257/331
See application file for complete search history.

(56) References Cited

U.S. PATENT DOCUMENTS

7,859,051 B2 * 12/2010 Siemieniec et al. .......... 257/334
8,058,685 B2 * 11/2011 Hsieh .......................... 257/330

* cited by examiner

*Primary Examiner* — Mary Wilczewski
*Assistant Examiner* — Toniae Thomas
(74) *Attorney, Agent, or Firm* — Bacon & Thomas, PLLC

(57) ABSTRACT

A power semiconductor device with improved avalanche capability is disclosed by forming at least one avalanche capability enhancement doped region underneath an ohmic contact doped region. Moreover, a source mask is saved by using three masks process and the avalanche capability is further improved.

16 Claims, 30 Drawing Sheets

AVALANCHE CAPABILITY IMPROVEMENT IN POWER SEMICONDUCTOR DEVICES USING THREE MASKS PROCESS

CROSS REFERENCE TO RELATED APPLICATIONS

This application is a Continuation-In-Part (CIP) of U.S. patent application Ser. No. 13/585,059 of the same inventor, filed on Aug. 14, 2012, entitled "method for manufacturing a power semiconductor device".

FIELD OF THE INVENTION

This invention related generally to the cell structure and device configuration of power semiconductor devices. More particularly, this invention relates to power semiconductor devices with improved avalanche capability.

BACKGROUND OF THE INVENTION

In U.S. Pat. No. 6,888,196, a conventional structure of power semiconductor device is disclosed, as shown in FIG. 1, wherein an N-channel trench MOSFET comprising a plurality of trenched gates 110 surrounded by n+ source regions 112 encompassed in P body regions 114 is formed in an N epitaxial layer 102 over an N+ substrate 100. To connect the source regions 112 and the body regions 114 to a source metal 122, a trenched source-body contact structure 118 with vertical sidewalls is employed penetrating through a contact interlayer 120, the n+ source regions 112 and extending into the P body regions 114. Furthermore, a p+ body ohmic contact doped region 116 is implanted surrounding bottom of the trenched source-body contact structure 118 to decrease a contact resistance between the P body regions 114 and the trenched source-body contact structure 118.

The conventional structure in FIG. 1 is accoutering a technical difficulty which is that avalanche always occurs near bottom of the trenched gates 110, causing a hazardous condition to the power semiconductor device. As we all know that, in the trench MOSFET shown in FIG. 1, an avalanche current Iav (illustrated in FIG. 1) flows between the trenched gates 110 and the trenched source-body contact structure 118, triggering turning-on of a parasitic bipolar transistor (illustrated in FIG. 1) when Iav*Rb>0.7V, wherein Rb is a resistance between the p+ body ohmic contact doped region 116 and channel regions near the trenched gates 110. As is known to all that, the doping concentration of the p+ body ohmic contact doped region 116 is higher than that of the P body regions 114 (please refer to FIG. 2 for $Y_1$-$Y_1'$ cross section of FIG. 1), which is helpful to decrease resistance Rb, however, as the sidewalls of the trenched source-body contact structure 118 is perpendicular to front surface of the N epitaxial layer 102, after carrying out implantation through a contact opening and filling with a W (tungsten) plug for formation of the trenched source-body contact structure 118, the p+ body ohmic contact doped region 116 can be formed only surrounding bottom of the trenched source-body contact structure 118, resulting in a high resistance Rb underneath the n+ source regions 112. Therefore, the parasitic bipolar transistor is easily to be triggered turning on due to the high resistance Rb, thus weakening the avalanche capability of the trench MOSFET.

FIG. 3 shows another trench MOSFET in prior art disclosed in U.S. Patent Publication No. 20080890357. Comparing to FIG. 1, the trench MOSFET in FIG. 3 comprises a plurality of trenched gates 130 having terrace gate structure for gate resistance reduction, wherein top surface of gate conductive layer filled in gate trenches is higher than the sidewalls of the gate trenches. However, the limitation of poor avalanche capability discussed above is still pronounced in this structure due to the easily turning-on of a parasitic bipolar transistor and the occurring of avalanche near bottom of the trenched gates 130.

For other power semiconductor device, for example trench IGBTs (Insulated Gate Bipolar Transistors), the same disadvantage of poor avalanche capability is also affecting the performance of the power semiconductor device.

Accordingly, it would be desirable to provide new and improved power semiconductor devices to avoid the constraint discussed above.

SUMMARY OF THE INVENTION

The present invention has been conceived to solve the above-described problems with the related art, and it is an object of the invention to provide a technique which makes it possible to avoid the avalanche occurring near bottom of the trenched gates and to prevent the parasitic bipolar transistor from turning-on. Moreover, the present invention provides three masks process to save a source mask and the avalanche capability is further improved.

In order to solve the above-described problems, according to a first aspect of the invention, there is provided a power semiconductor device comprising a plurality of trench MOSFETs with each comprising: a substrate of a first conductivity type; an epitaxial layer of the first conductivity type over the substrate, wherein the epitaxial layer has a lower doping concentration than the substrate; a plurality of gate trenches extending into the epitaxial layer, wherein each of the gate trenches has a gate oxide layer lining its inner surface and a doped poly-silicon layer thereon; a body region of a second conductivity type surrounding sidewalls of each of the gate trenches; a source region of the first conductivity type near a top surface of the body region, wherein the source region surrounds top portion of sidewalls of each of the gate trenches, and has a higher doping concentration than the epitaxial layer; a contact insulation layer disposed over the epitaxial layer and covering outer surface of the doped poly-silicon layer; a contact opening locating between every two adjacent of the gate trenches, opened through the contact insulation layer and the source region, and extended into the body region; a body ohmic contact doped region of the second conductivity type formed within the body region, surrounding at least bottom of each the contact opening, wherein the body ohmic contact doped region has a higher doping concentration than the body region; at least one avalanche capability enhancement doped region of the second conductivity type underneath each the body ohmic contact doped region, wherein the avalanche capability enhancement region has a higher doping concentration than the body region but a lower doping concentration than the body ohmic contact doped region; a metal plug filled in the contact opening; a source metal disposed covering top surface of the contact insulation layer; a drain metal disposed on back surface of the substrate; the source region having a doping concentration along sidewalls of the contact opening higher than along an adjacent channel region near the gate trenches at a same distance from the top surface of the epitaxial layer, and the source region having a junction depth along the sidewalls of the contact opening greater than along the adjacent channel region from the top surface of the epitaxial layer.

Firstly, the at least one avalanche capability enhancement doped region is formed underneath the body ohmic contact doped region. Second, as Unclamp Inductive Switching (UIS) test is used to evaluate avalanche capability by measuring UIS current at breakdown voltage, in FIG. 4, by adding a P* avalanche capability enhancement region 218 underneath a p+ body ohmic contact doped region 216 in an N-channel trench MOSFET (please refer to FIG. 5 for $Y_2$-$Y_2'$ cross section of FIG. 4), the avalanche current lay is shifted from bottom of the gate trenches to underneath the contact opening 212 so that the avalanche current Jay directly flows to the source metal 220 to enhance UIS current (as shown in FIG. 6) at expense of slight degradation of breakdown voltage (as shown in FIG. 7) for depth of the body regions less than 1.0 μm but not affect on breakdown voltage for depth of the body regions greater than 1.0 μm.

According to a second aspect of the present invention, there is provided a power semiconductor device comprising a plurality of trench MOSFETs with each comprising only one avalanche capability enhancement doped region underneath the body ohmic contact doped region, wherein the avalanche capability enhancement doped region is formed completely within the body region.

According to a third aspect of the present invention, there is provided a power semiconductor device comprising a plurality of trench MOSFETs with each comprising only one avalanche capability enhancement doped region underneath the body ohmic contact doped region, wherein the avalanche capability enhancement doped region is formed partially overlap with the body region and partially extending into the epitaxial layer but shallower than the gate trenches.

According to a fourth aspect of the present invention, there is provided a power semiconductor device comprising a plurality of trench MOSFETs with each comprising multiple of avalanche capability enhancement doped regions, and one of which is formed partially overlap with the body region and partially extending into the epitaxial layer but shallower than the gate trenches and others are disposed within the body region, for example in FIG. 9 having two avalanche capability enhancement doped regions (418 and 418'). Please refer to FIG. 10 for the $Y_3$-$Y_3'$ cross section of FIG. 9.

According to a fifth aspect of the present invention, there is provided a power semiconductor device comprising a plurality of trench MOSFETs with each comprising the doped poly-silicon layer protruding out from each of the gate trenches and at least a portion of the doped poly-silicon positioned higher than the sidewalls of each of the gate trenches.

According to a sixth aspect of the present invention, there is provided a power semiconductor device comprising a plurality of trench MOSFETs with each comprising the doped poly-silicon layer having a top surface not higher than the sidewalls of each of the gate trenches.

According to a seventh aspect of the present invention, there is provided a power semiconductor device comprising a plurality of trench MOSFETs with each comprising the contact opening having sidewalls with taper angle $\alpha_1$ within the source region, and having sidewalls with taper angle $\alpha_2$ in the body region with respect to the top surface of the epitaxial layer, wherein the taper angle $\alpha_1$ is equal to or less than 90 degree and equal to or greater than the taper angle $\alpha_2$. By employing this structure with the taper angle $\alpha_2$ is less than 90 degree, the area of the body ohmic contact doped region is enlarged surrounding not only bottom but also sidewalls of each the contact opening, thus further enhancing UIS performance.

According to an eighth aspect of the present invention, there is provided a method of manufacturing a power semiconductor device comprising: forming a trench mask over a top surface of an epitaxial layer of first conductivity type, the trench mask having apertures defining location of a plurality of gate trenches; etching through the apertures in the trench mask to form a plurality of gate trenches in the epitaxial layer; forming a gate oxide layer on inner surface of the gate trenches; depositing a gate conductive layer over the gate oxide layer in the gate trenches and onto the top surface of the epitaxial layer; etching or CMP (Chemical Mechanical Polishing) the gate conductive layer so that the gate conductive layer is removed away from the top surface of the epitaxial layer for formation of a plurality of trenched gates; forming a body region of a second conductivity type extending between every two adjacent of the gate trenches; depositing a contact insulation layer over the top surface of the epitaxial layer; applying a contact mask and following with a dry oxide etching to remove the contact insulation layer from a contact opening defined by the contact mask; implanting the epitaxial layer with a source dopant of the first conductivity type through the contact opening and diffusing the source dopant to form a source region in the contact opening in an active area, thereby a source mask is saved; carrying out a dry silicon etch to make the contact opening further penetrate through the source region and extend into the body region; forming a body ohmic contact doped region of the second conductivity type by ion implantation surrounding at least bottom of the contact opening; and forming at least one avalanche capability enhancement region underneath the body ohmic contact doped region by ion implantation.

According to a ninth aspect of the present invention, there is provided a method of manufacturing a power semiconductor device, wherein the ion implantation for formation of at least one avalanche capability enhancement region is carried out with energy ranging from 100 KeV to 300 KeV and with dose from 1E12 to 1E14 $cm^{-2}$.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
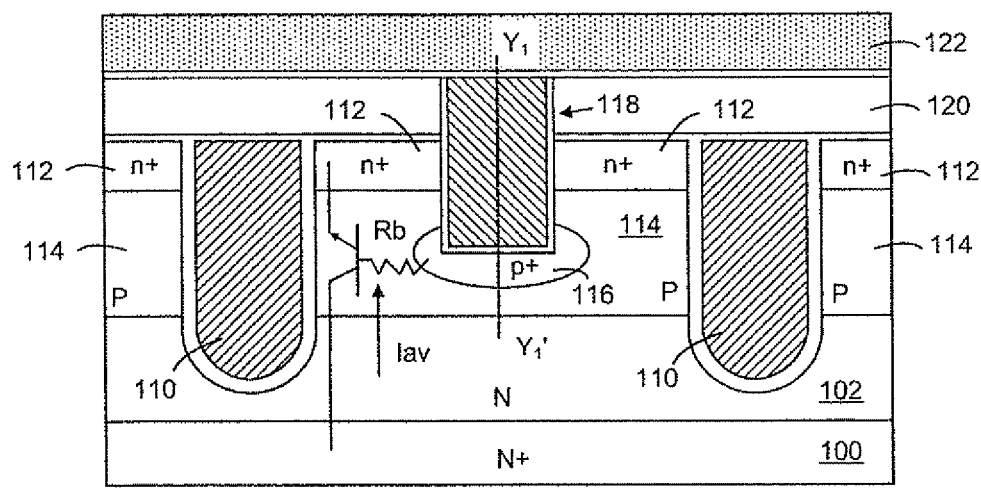
FIG. 1 is a side cross-sectional view of a power semiconductor device of prior art.
Figure 2:
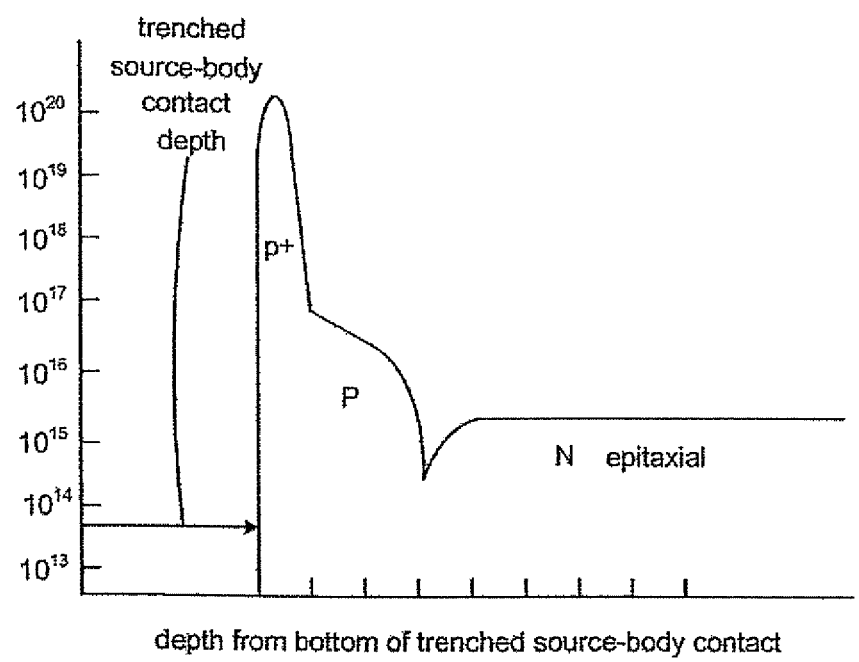
FIG. 2 is a graph showing $Y_1$-$Y_1'$ cross section of FIG. 1.
Figure 3:
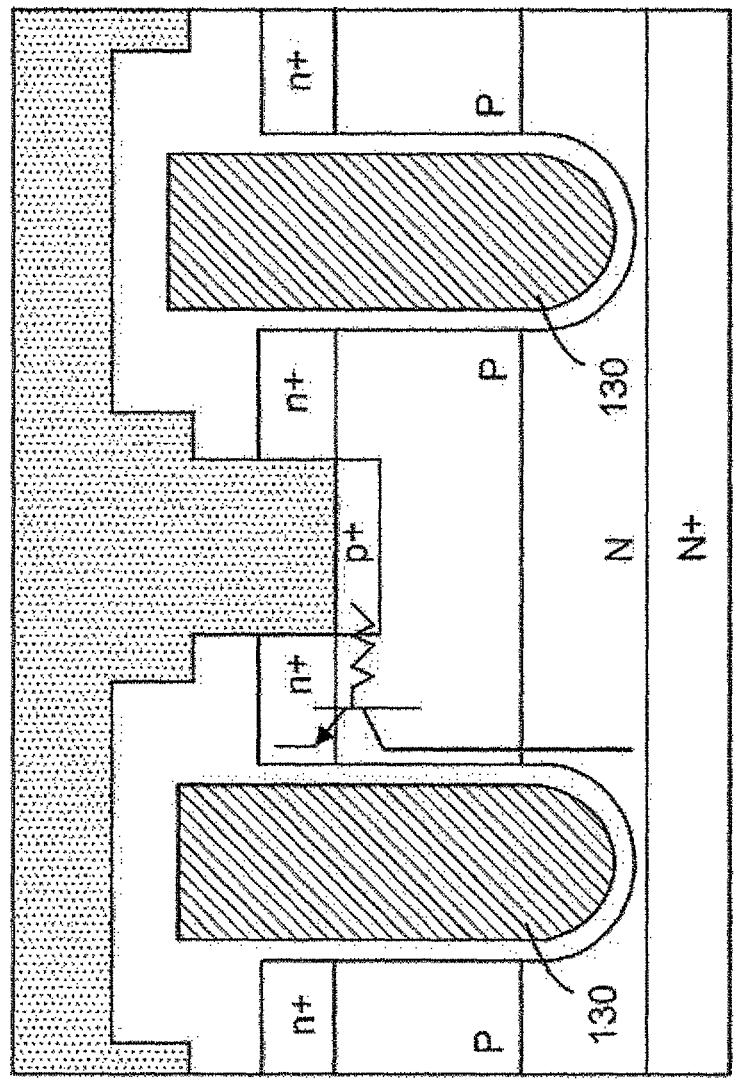
FIG. 3 is a side cross-sectional view of a power semiconductor device of another prior art.
Figure 4:
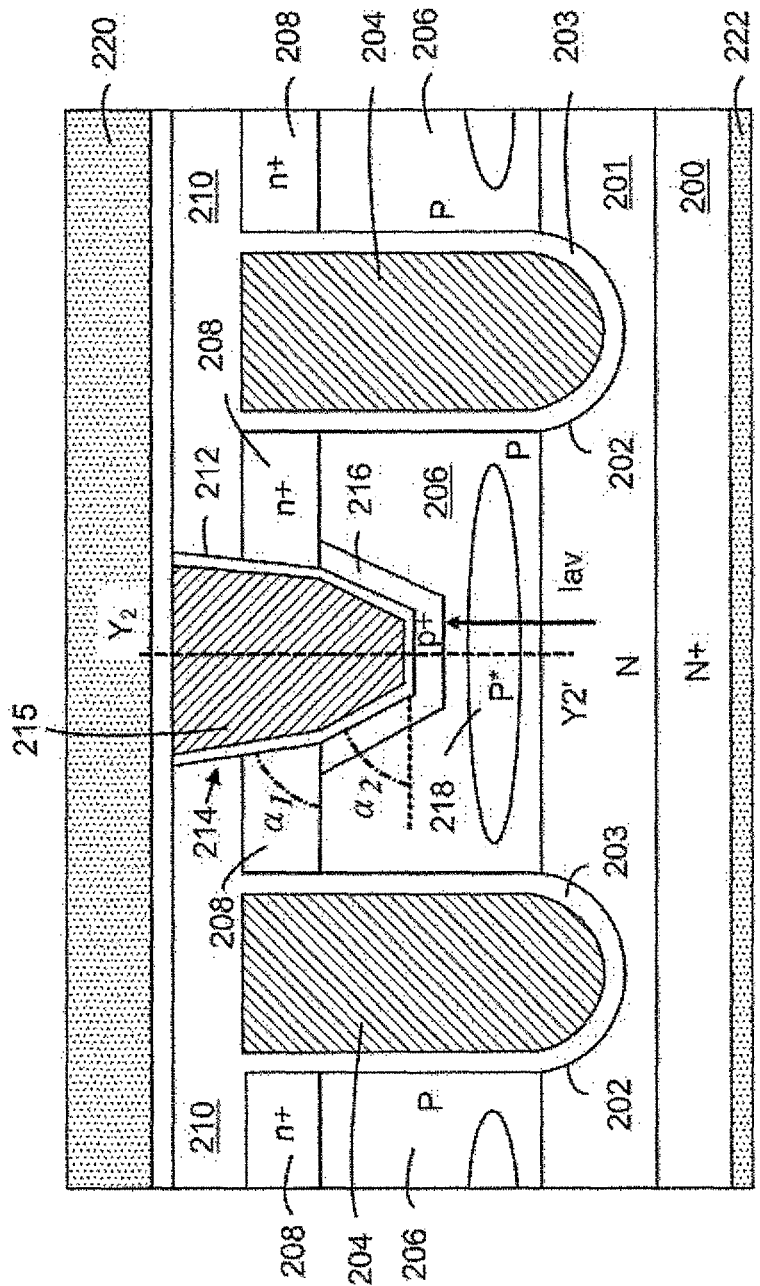
FIG. 4 is a side cross-sectional view of a preferred embodiment according to the present invention.
Figure 5:
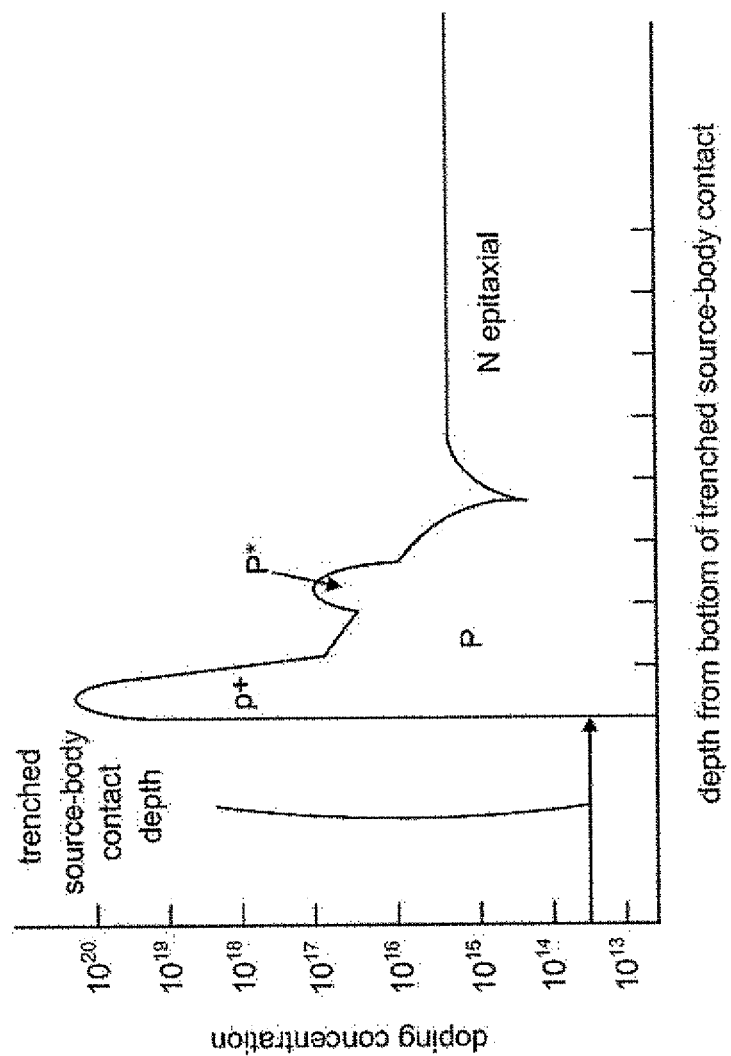
FIG. 5 is a graph showing $Y_2$-$Y_2'$ cross section of FIG. 4
Figure 6:
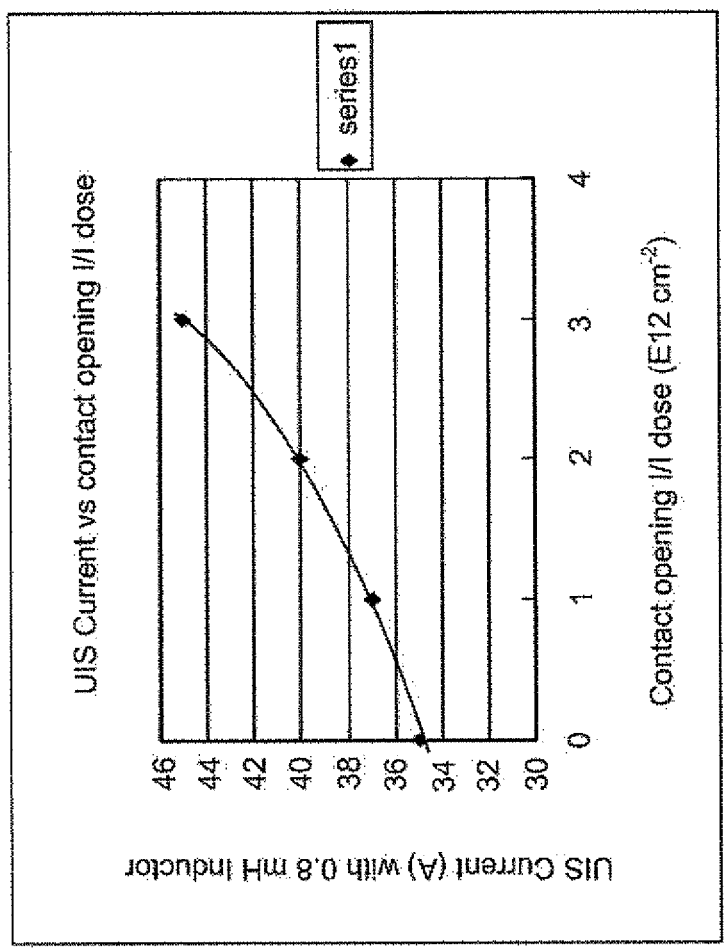
FIG. 6 is a graph showing relationship between UIS current and dose of ion implantation through trenched source-body contact for formation of an avalanche capability enhancement doped region.
Figure 7:
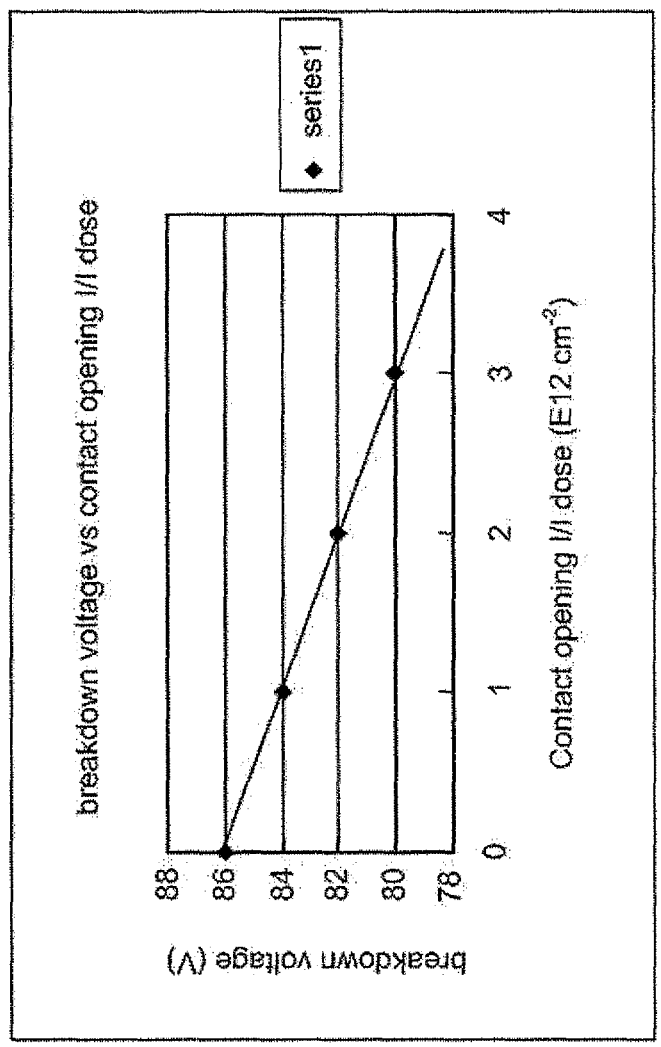
FIG. 7 is a graph showing relationship between breakdown voltage and dose of ion implantation through contact opening for formation of an avalanche capability enhancement doped region.

Please refer to FIG. 4 for a cross sectional-view of a preferred N-channel trench MOSFET which formed on an N+ substrate 200 with back metal 222 of Ti/Ni/Ag on back surface as drain electrode. Onto the N+ substrate 200, a lighter doped N epitaxial layer 201 is grown, and a plurality of trenched gates 204 are formed therein. The trenched gates 204 in this embodiment is implemented by filling a plurality of gate trenches 202 with a doped poly-silicon layer padded by a gate oxide layer 203, wherein top surface of the trenched gates 204 is not higher than sidewalls of the gate trenches 202. The preferred N-channel trench MOSFET further comprises: a P body region 206 formed in upper portion of the N epitaxial layer 201 and extending between every two adjacent of the gate trenches 202; an n+ source region 208 near top surface of the P body region 206 and surrounding the sidewalls of the gate trenches 202; a contact insulation layer 210 covering top surface of the N epitaxial layer 201 and the trenched gates 204; a trenched source-body contact structure 214 implemented by filling a contact opening 212 with a metal plug 215, for example W (tungsten) plug in this embodiment, padding by a barrier layer 213 of Ti/TiN or Co/TiN or Ta/TiN. As alternative, the metal plug 215 can also be implemented by using a source metal directly filling into the contact opening. Specifically, the trenched source-body contact structure 214 in this embodiment has slope sidewalls penetrating through the contact insulation layer 210 and the n+ source region 208 with a taper angle $\alpha_1$, and extending into the P body region 206 with a taper angle $\alpha_2$, wherein $\alpha_1$ is less than 90 degree and greater than $\alpha_2$. Therefore, underneath the trenched source-body contact structure 214, a p+ body ohmic contact doped region 216 is surrounding its bottom and the sidewalls with taper angle $\alpha_2$ due to the enlargement of implantation area. According to the present invention, in this preferred embodiment, there is only one P* avalanche capability enhancement doped region 218 underneath the p+ body ohmic contact doped region 216 and completely within the P body region 206 to shift avalanche occurrence from bottom of the gate trenches 202 to underneath the trenched source-body contact structure 214. Onto the contact insulation layer 210 and the trenched source-body contact structure 214, a front metal of Al alloys or Cu alloys is deposited acting as a source metal 220 to be connected to the n+ source region 208 and the P body region 206 via the trenched source-body contact structure 214, wherein the source metal 220 is padded by a resistance-reduction layer 220' of Ti or Ti/TiN beneath.

Figure 8:
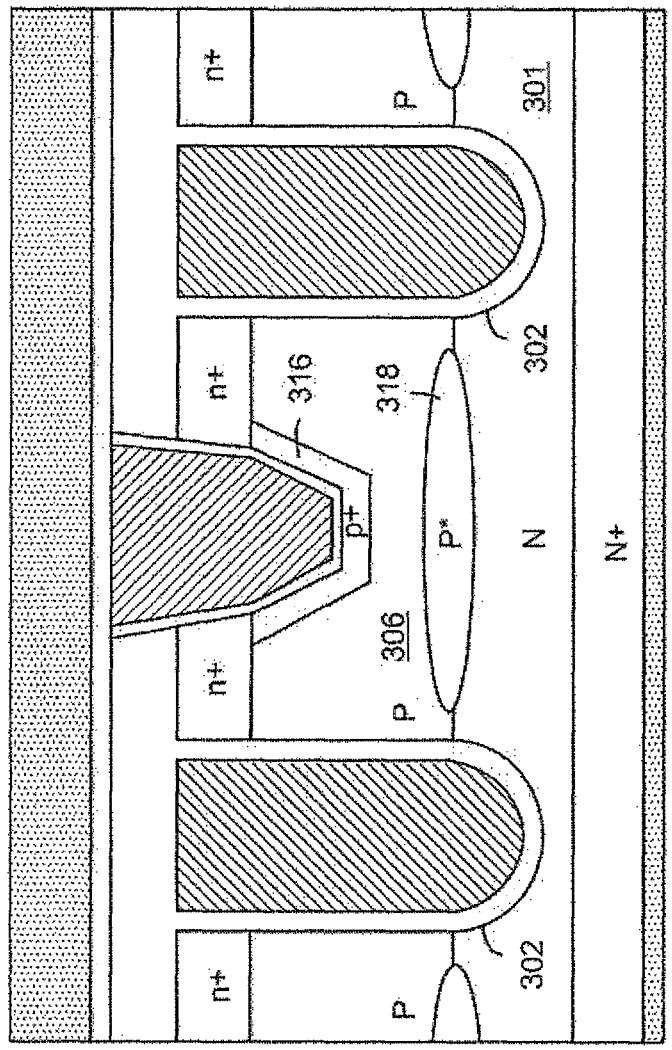
FIG. 8 is a side cross-sectional view of another preferred embodiment according to the present invention.

Please refer to FIG. 8 for a cross sectional-view of another preferred N-channel trench MOSFET which is similar to that in FIG. 4 except that, underneath the p+ body ohmic contact doped region 316, the P* avalanche capability enhancement doped region 318 is formed partially overlap with the P body region 306 and partially extending into the N epitaxial layer 301 but shallower than the gate trenches 302.

Figure 9:
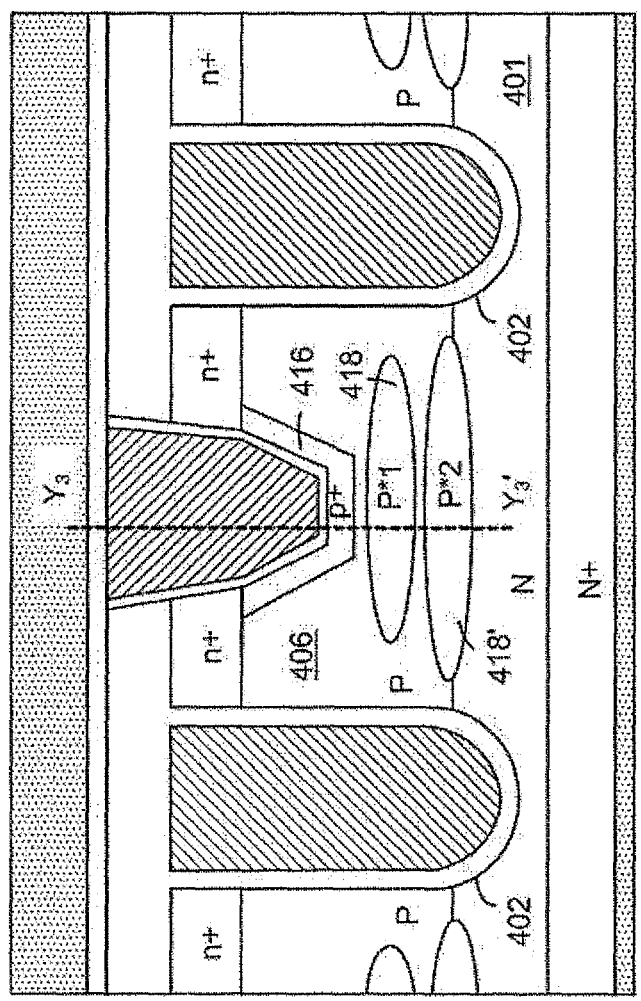
FIG. 9 is a side cross-sectional view of another preferred embodiment according to the present invention.
Figure 10:
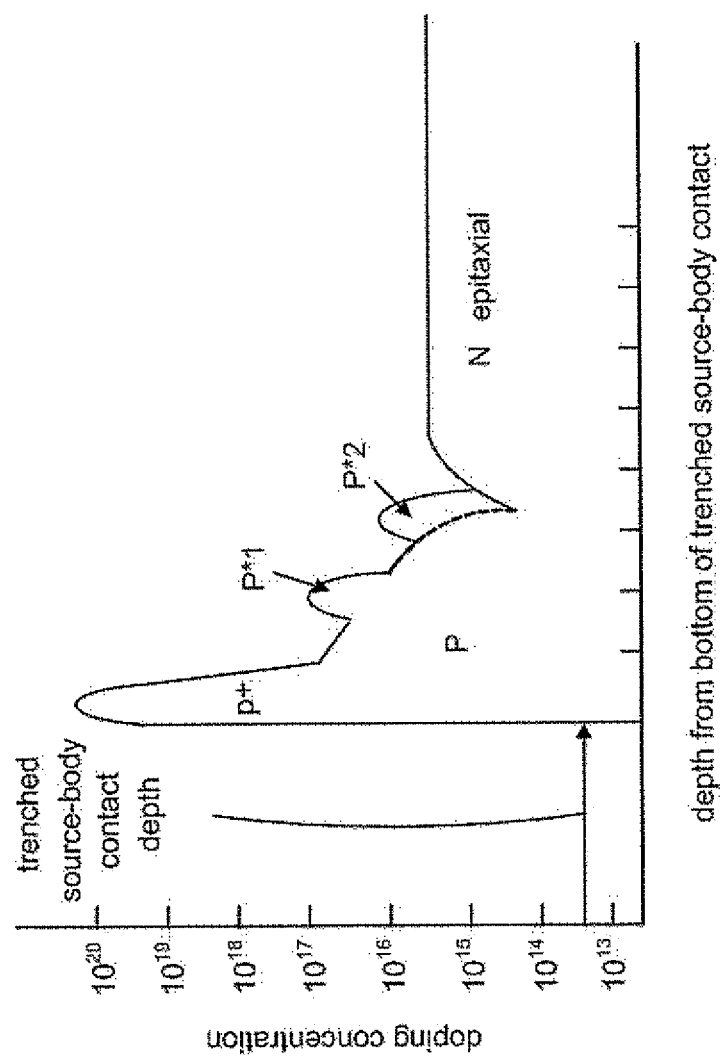
FIG. 10 is a graph showing $Y_3$-$Y_3'$ cross section of FIG. 9.

Please refer to FIG. 9 for a cross sectional-view of another preferred N-channel trench MOSFET which is similar to that in FIG. 4 except that, underneath the p+ body ohmic contact doped region 416, there are two avalanche capability enhancement regions: P*1 and P*2, wherein the P*1 avalanche capability enhancement doped region 418 is formed completely within the P body region 406, and the P*2 avalanche capability enhancement doped region 418' is formed partially overlap with the P body region 406 and partially extending into the N epitaxial layer 401 but shallower than the gate trenches 402.

Figure 11:
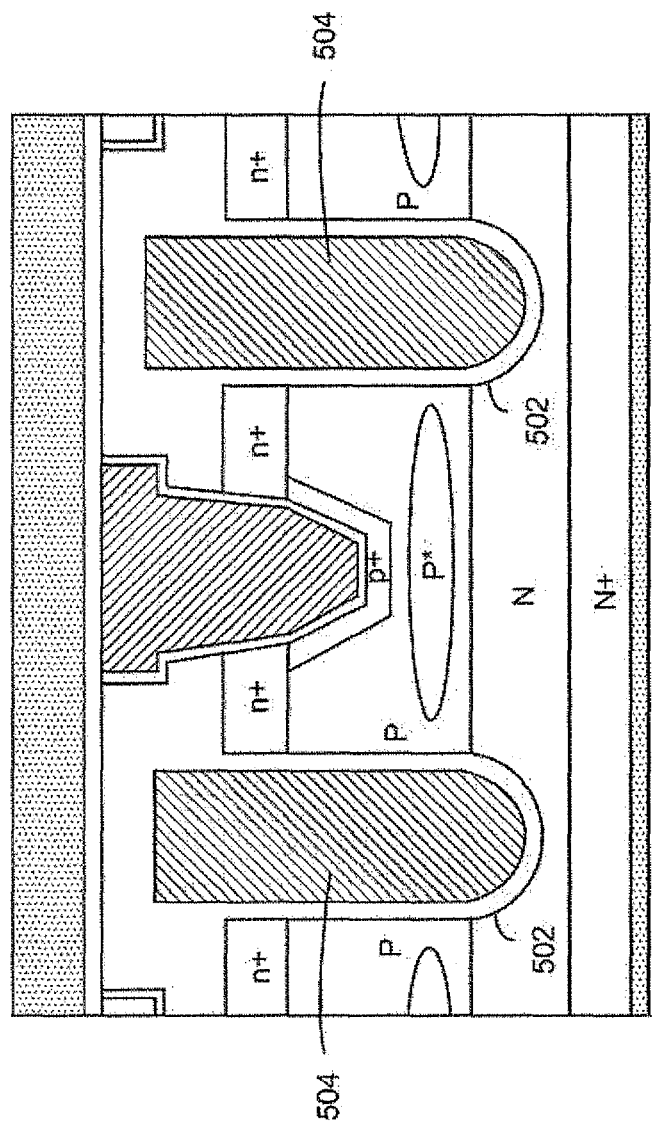
FIG. 11 is a side cross-sectional view of another preferred embodiment according to the present invention.

Please refer to FIG. 11 for a cross sectional-view of another preferred N-channel trench MOSFET which is similar to that in FIG. 4 except that, the trenched gates 504 protrude out from the gate trenches 502, which means top surface of the trenched gates 504 is higher than sidewalls of the gate trenches 502 to form terrace trenched gates for gate resistance reduction.

Figure 12:
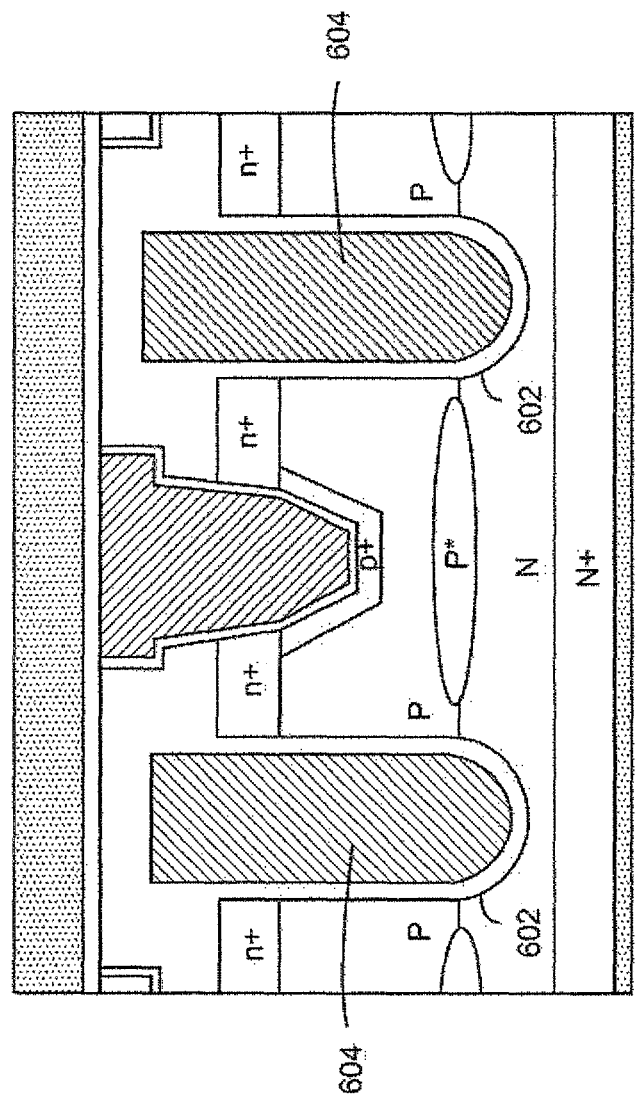
FIG. 12 is a side cross-sectional view of another preferred embodiment according to the present invention.

Please refer to FIG. 12 for a cross sectional-view of another preferred N-channel trench MOSFET which is similar to that in FIG. 8 except that, the trenched gates 604 protrudes out from the gate trenches 602, which means top surface of the trenched gates 604 is higher than sidewalls of the gate trenches 602 to form terrace trenched gates for gate resistance reduction.

Figure 13:
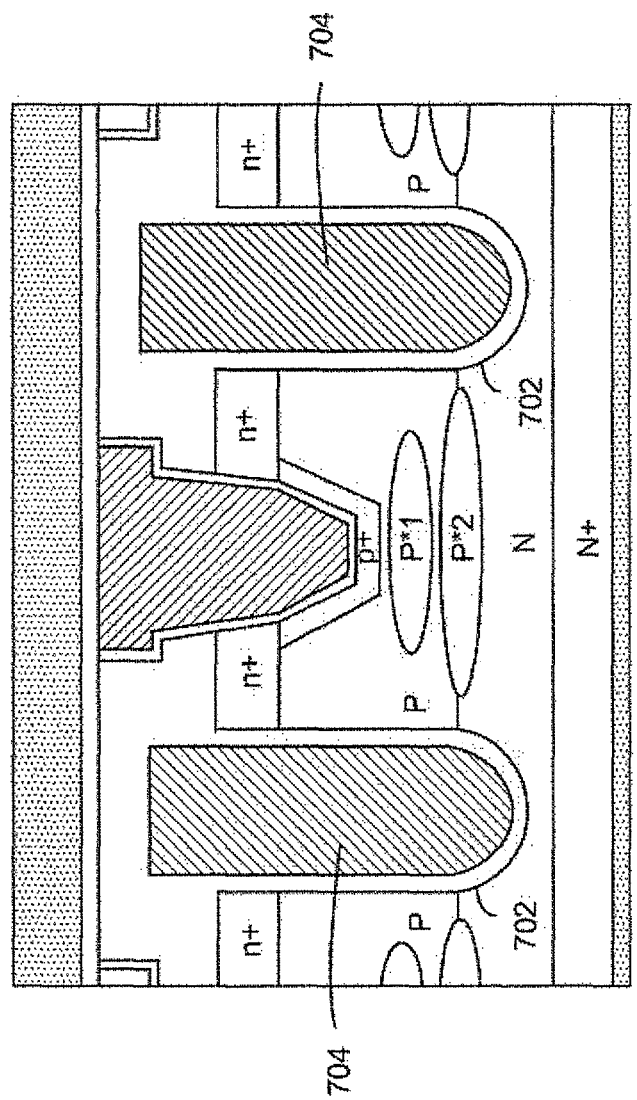
FIG. 13 is a side cross-sectional view of another preferred embodiment according to the present invention.

Please refer to FIG. 13 for a cross sectional-view of another preferred N-channel trench MOSFET which is similar to that in FIG. 9 except that, the trenched gates 704 protrudes out from gate trenches 702, which means top surface of the trenched gates 704 is higher than sidewalls of the gate trenches 702 to form terrace trenched gates for gate resistance reduction.

Figure 14:
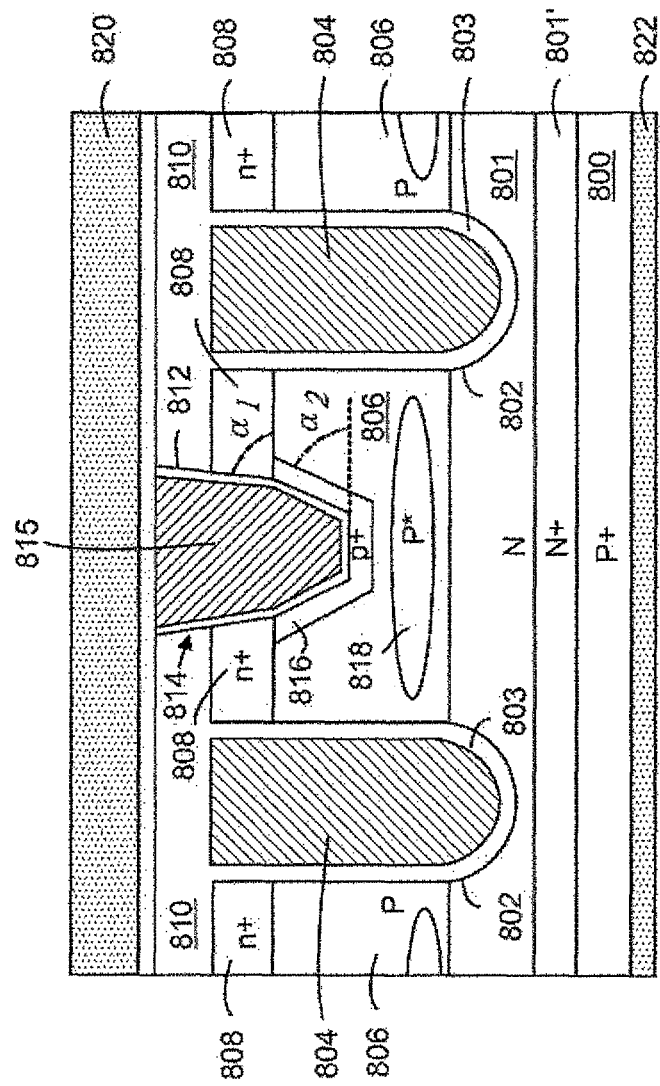
FIG. 14 is a side cross-sectional view of another preferred embodiment according to the present invention.

Please refer to FIG. 14 for a cross sectional-view of a preferred N-channel trench IGBT which formed on a P+ substrate 800 with back metal 822 of Ti/Ni/Ag on back surface as collector electrode. Onto the P+ substrate 800, a first N+ epitaxial layer 810' and a second N epitaxial layer 801 is successively grown, and a plurality of trenched gates 804 are formed inside the second N epitaxial layer 801. The trenched gates 804 in this embodiment is implemented by filling a plurality of gate trenches 802 with doped poly-silicon layer padded by a gate oxide layer 803, wherein top surface of the trenched gates 804 not higher than sidewalls of the gate trenches 802. The preferred N-channel trench IGBT further comprises: a P base region 806 formed in upper portion of the second N epitaxial layer 801 and extending between every two adjacent of the gate trenches 802; an n+ emitter region 808 near top surface of the P base region 806 and surrounding the sidewalls of the gate trenches 802; a contact insulation layer 810 covering top surface of the second N epitaxial layer 801 and the trenched gates 804; a trenched emitter-base contact structure 814 implemented by filling a contact opening 812 with a W plug 815 padded by a barrier layer 813 of Ti/TiN or Co/TiN or Ta/TiN. Specifically, the trenched emitter-base contact structure 814 has slope sidewall penetrating through the contact insulation layer 810 and the n+ emitter region 808 with a taper angle $\alpha_1'$, and extending into the P base region with a taper angle $\alpha_2'$, wherein $\alpha 1'$ is less than 90 degree and greater than $\alpha 2'$. Therefore, underneath the trenched emitter-base contact structure 814, a p+ base ohmic contact doped region 816 is surrounding its bottom and the sidewall with taper angle $\alpha_2'$ due to the enlargement of implantation area. According to the present invention, in this preferred embodiment, there is only one avalanche capability enhancement doped region P* 818 underneath the p+ base ohmic contact doped region 816 and completely within the P base region 806 to shift avalanche occurrence from bottom of the gate trenches 802 to underneath the trenched emitter-base contact structure 814. Onto the contact insulation layer 810 and the trenched emitter-base contact structure 814, a front metal of Al alloys or Cu alloys is deposited acting as an emitter metal 820 to be connected to the n+ emitter region 808 and the P base region 806 via the trenched emitter-base contact structure 814, wherein the emitter metal 820 is padded by a resistance-reduction layer 820' of Ti or Ti/TiN beneath.

Figure 15:
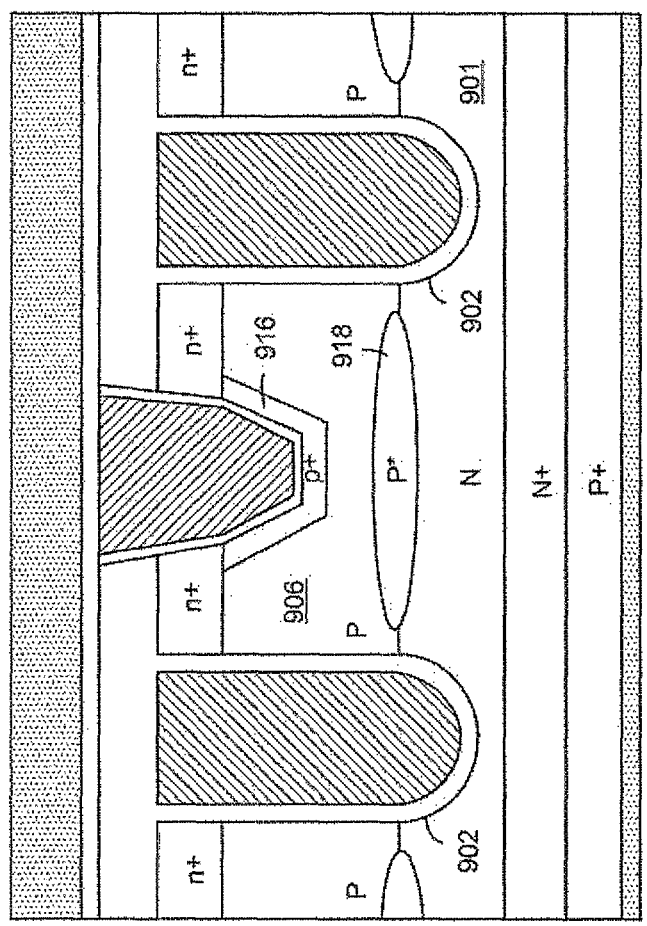
FIG. 15 is a side cross-sectional view of another preferred embodiment according to the present invention.

Please refer to FIG. 15 for a cross sectional-view of another preferred N-channel trench IGBT which is similar to that in FIG. 14 except that, underneath the p+ base ohmic contact doped region 916, the P* avalanche capability enhancement doped region 918 is formed partially overlap with the P base region 906 and partially extending into the second N epitaxial layer 901 but shallower than the gate trenches 902.

Figure 16:
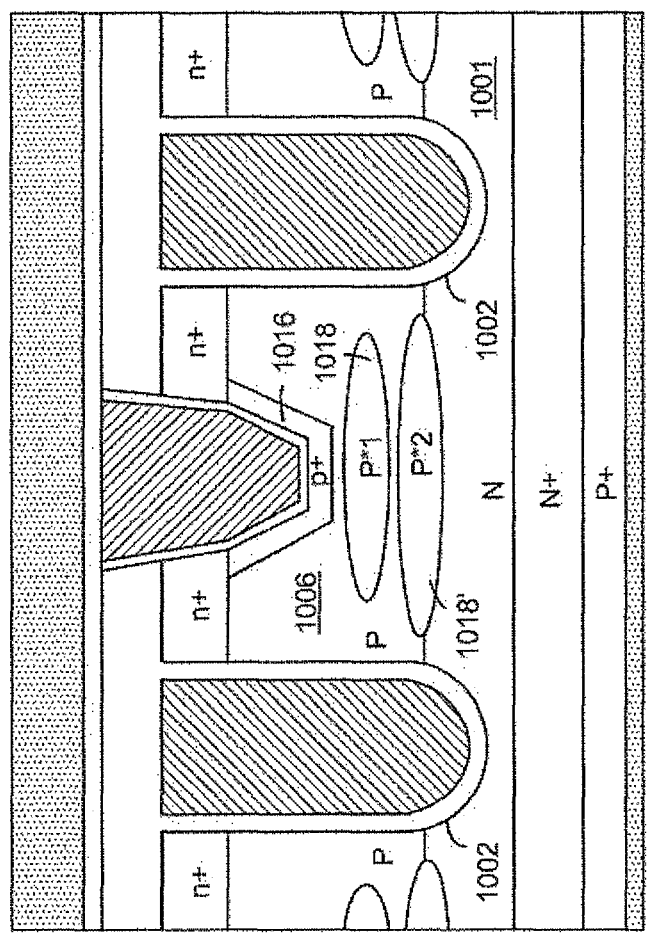
FIG. 16 is a side cross-sectional view of another preferred embodiment according to the present invention.

Please refer to FIG. 16 for a cross sectional-view of another preferred N-channel trench IGBT which is similar to that in FIG. 14 except that, underneath the p+ base ohmic contact doped region 1016, there are two avalanche capability enhancement doped regions: P*1 and P*2, wherein the P*1 avalanche capability enhancement doped region 1018 is formed completely within the P base region 1006, and the P*2 avalanche capability enhancement doped region 1018' is formed partially overlap with the P base region 1006 and partially extending into the second N epitaxial layer 1001 but shallower than the gate trenches 1002.

Figure 17:
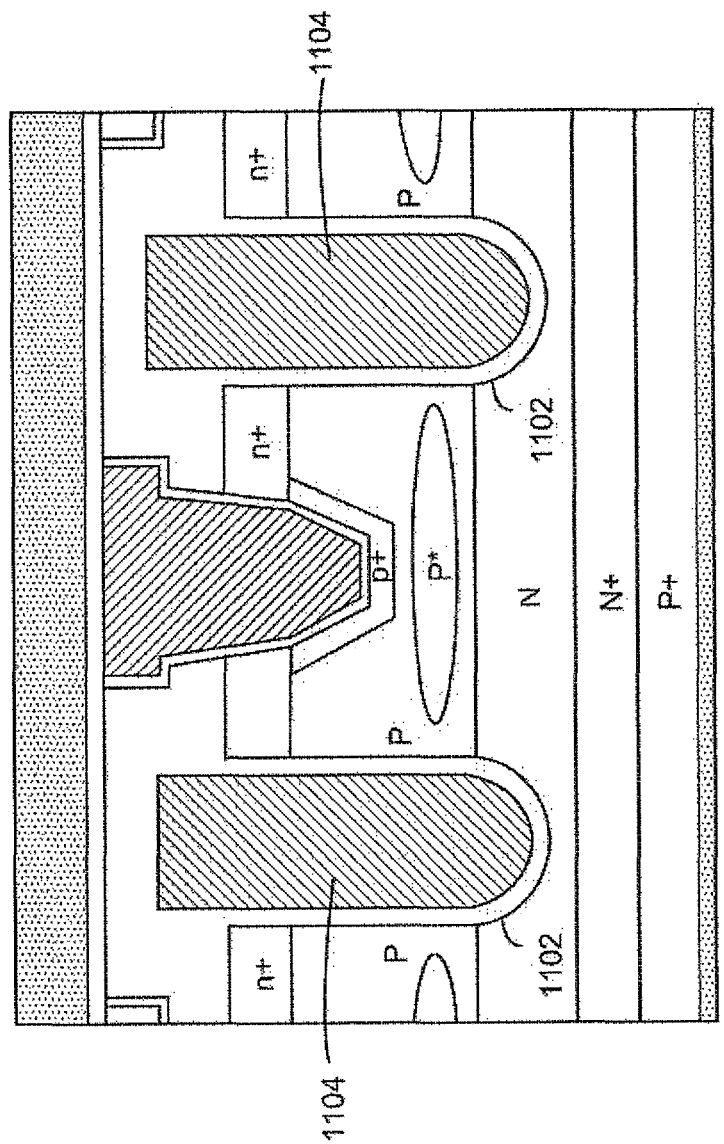
FIG. 17 is a side cross-sectional view of another preferred embodiment according to the present invention.

Please refer to FIG. 17 for a cross sectional-view of another preferred N-channel trench IGBT which is similar to that in FIG. 14 except that, the trenched gates 1104 protrude out from gate trenches 1102, which means top surface of the trenched gates 1104 is higher than sidewalls of the gate trenches 1102 to form terrace trenched gates for gate resistance reduction.

Figure 18:
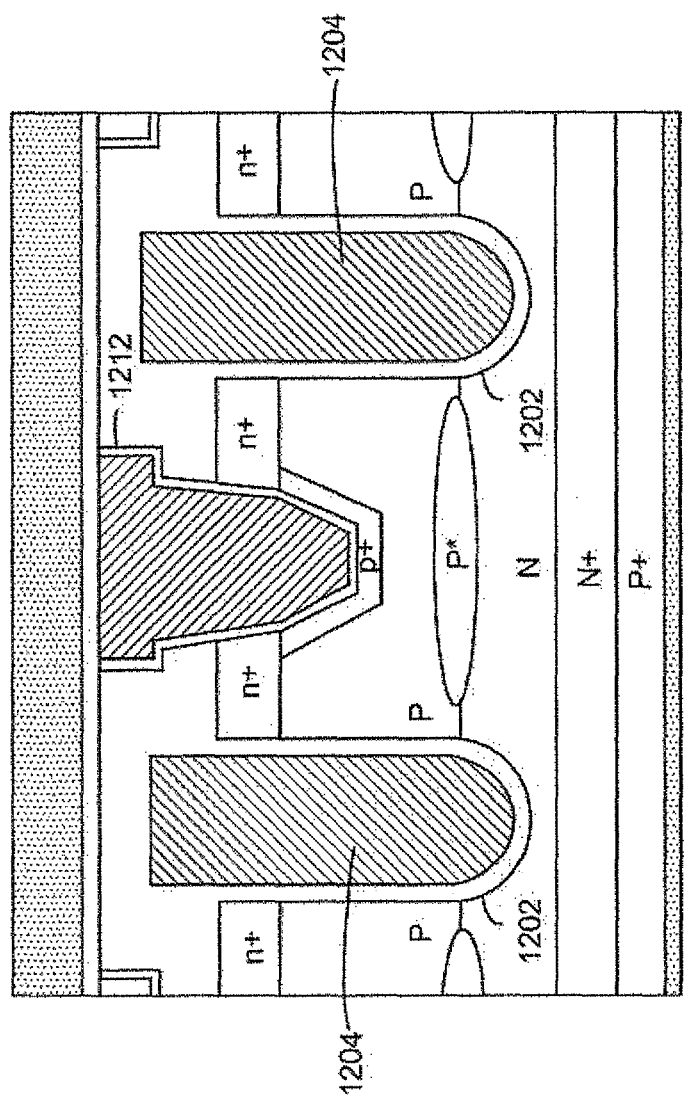
FIG. 18 is a side cross-sectional view of another preferred embodiment according to the present invention.

Please refer to FIG. 18 for a cross sectional-view of another preferred N-channel trench IGBT which is similar to that in FIG. 15 except that, the trenched gates 1204 protrude out from gate trenches 1202, which means top surface of the trenched gates 1204 is higher than sidewalls of the gate trenches 1202 to form terrace trenched gates for gate resistance reduction.

Figure 19:
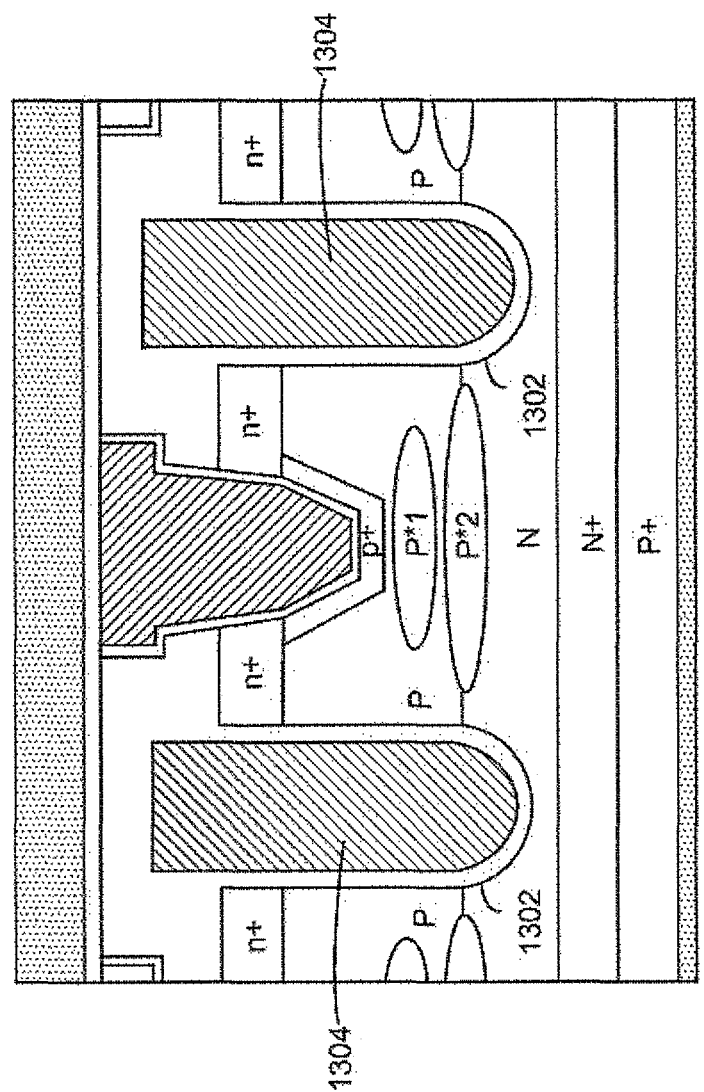
FIG. 19 is a side cross-sectional view of another preferred embodiment according to the present invention.

Please refer to FIG. 19 for a cross sectional-view of another preferred N-channel trench IGBT which is similar to that in FIG. 16 except that, the trenched gates 1304 protrude out from gate trenches 1302, which means top surface of the trenched gates 1304 is higher than sidewalls of the gate trenches 1302 to form terrace trenched gates for gate resistance reduction.

Figure 20:
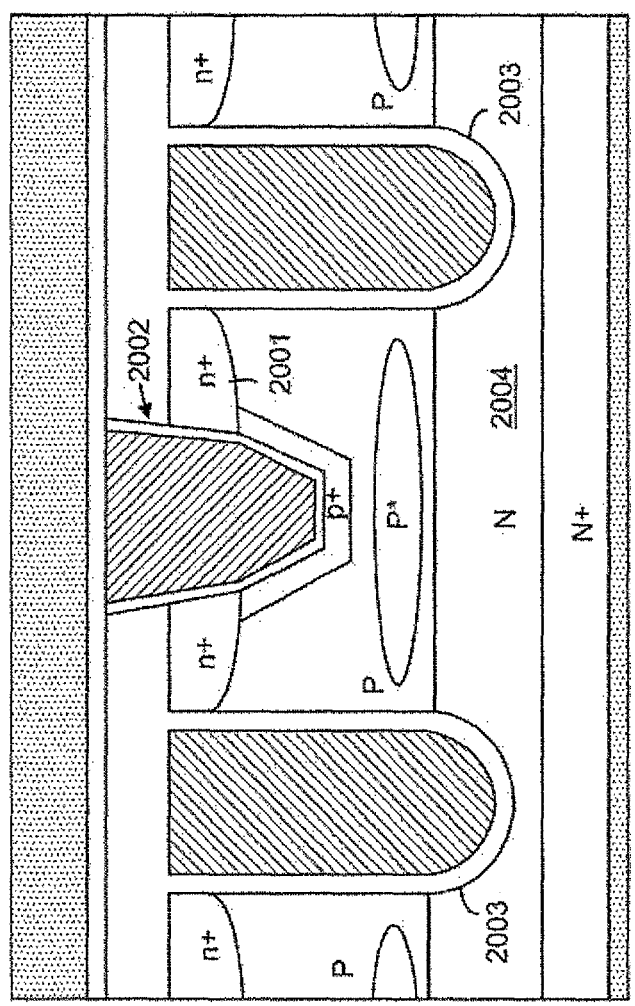
FIG. 20 is a side cross-sectional view of another preferred embodiment according to the present invention.

Please refer to FIG. 20 for a cross sectional-view of another preferred N-channel trench MOSFET which is similar to that in FIG. 4 except that, the n+ source region 2001 has a doping concentration along sidewalls of the trenched source-body contact structure 2002 higher than along an adjacent channel region near the gate trenches 2003 at a same distance from the top surface of the N epitaxial layer 2004, and the n+ source region 2001 has a junction depth along the sidewalls of the trenched source-body contact structure 2002 greater than along the adjacent channel region at a same distance from the top surface of the N epitaxial layer 2004.

Figure 21:
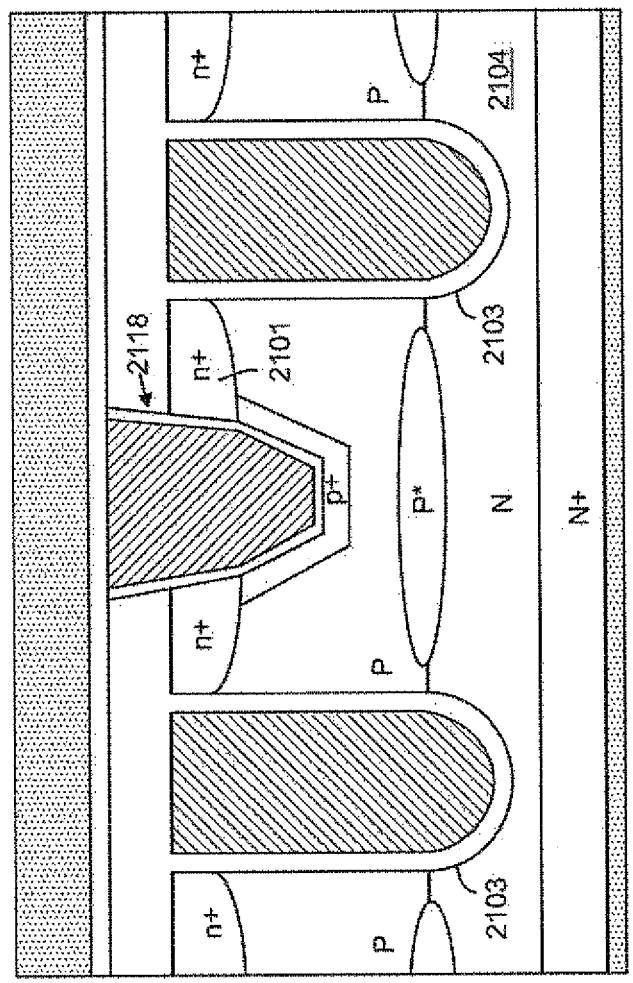
FIG. 21 is a side cross-sectional view of another preferred embodiment according to the present invention.

Please refer to FIG. 21 for a cross sectional-view of another preferred N-channel trench MOSFET which is similar to that in FIG. 8 except that, the n+ source region 2101 has a doping concentration along sidewalls of the trenched source-body contact structure 2118 higher than along an adjacent channel region near the gate trenches 2103 at a same distance from the top surface of the N epitaxial layer 2104, and the n+ source region 2101 has a junction depth along the sidewalls of the trenched source-body contact structure 2118 greater than along the adjacent channel region at a same distance from the top surface of the N epitaxial layer 2104.

Figure 22:
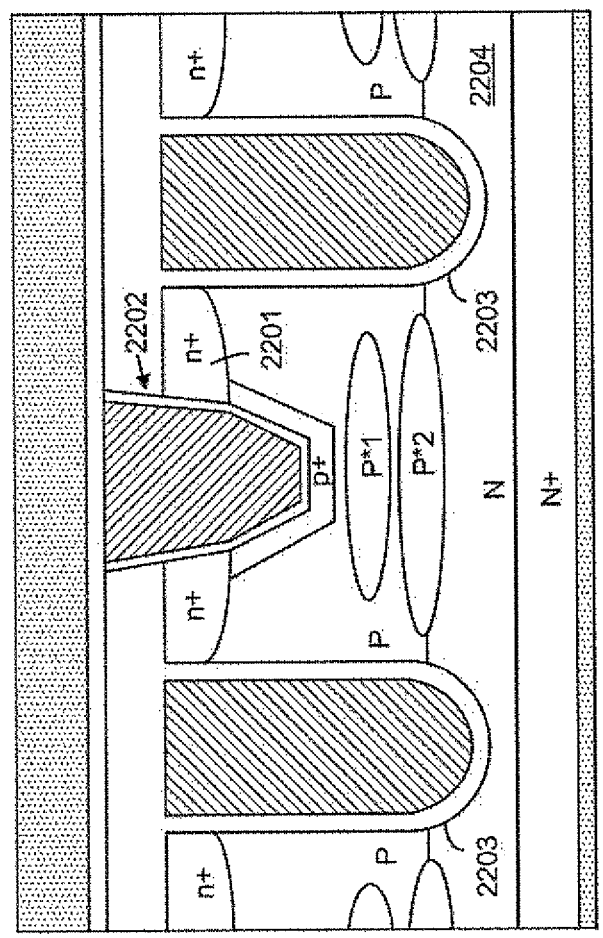
FIG. 22 is a side cross-sectional view of another preferred embodiment according to the present invention.

Please refer to FIG. 22 for a cross sectional-view of another preferred N-channel trench MOSFET which is similar to that in FIG. 9 except that, the n+ source region 2201 has a doping concentration along sidewalls of the trenched source-body contact structure 2202 higher than along an adjacent channel region near the gate trenches 2203 at a same distance from the top surface of the N epitaxial layer 2204, and the n+ source region 2201 has a junction depth along the sidewalls of the trenched source-body contact structure 2202 greater than along the adjacent channel region at a same distance from the top surface of the N epitaxial layer 2204.

Figure 23:
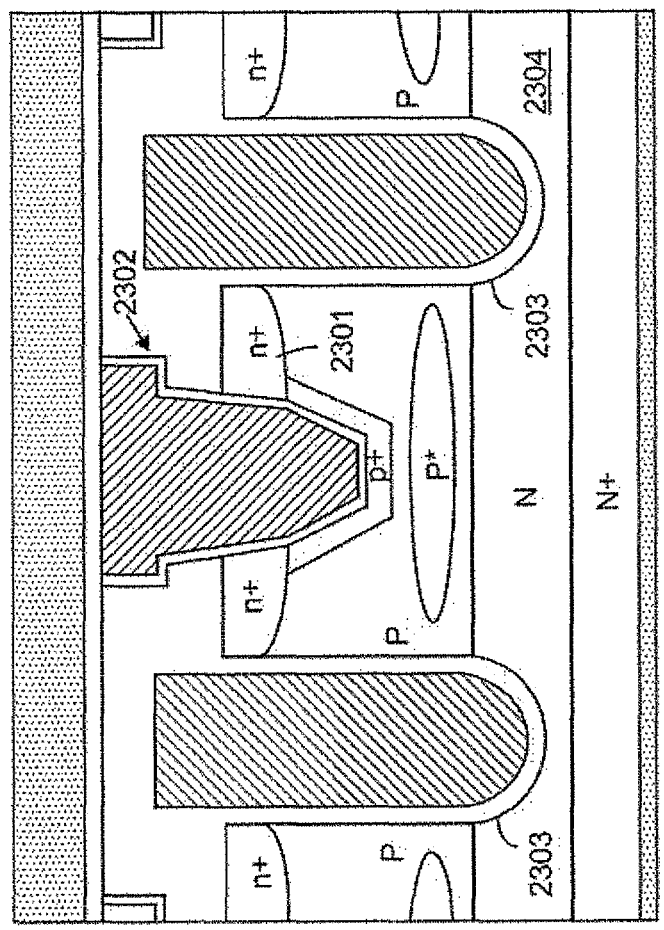
FIG. 23 is a side cross-sectional view of another preferred embodiment according to the present invention.

Please refer to FIG. 23 for a cross sectional-view of another preferred N-channel trench MOSFET which is similar to that in FIG. 11 except that, the n+ source region 2301 has a doping concentration along sidewalls of the trenched source-body contact structure 2302 higher than along an adjacent channel region near the gate trenches 2303 at a same distance from the top surface of the N epitaxial layer 2304, and the n+ source region 2301 has a junction depth along the sidewalls of the trenched source-body contact structure 2302 greater than along the adjacent channel region at a same distance from the top surface of the N epitaxial layer 2304.

Figure 24:
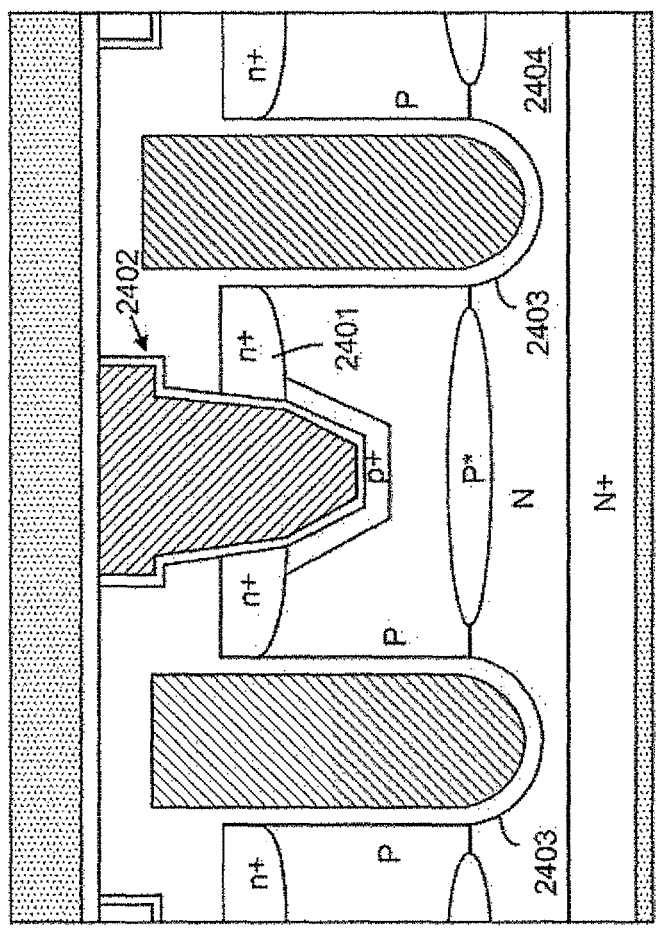
FIG. 24 is a side cross-sectional view of another preferred embodiment according to the present invention.

Please refer to FIG. 24 for a cross sectional-view of another preferred N-channel trench MOSFET which is similar to that in FIG. 12 except that, the n+ source region 2401 has a doping concentration along sidewalls of the trenched source-body contact structure 2402 higher than along an adjacent channel region near the gate trenches 2403 at a same distance from the top surface of the N epitaxial layer 2404, and the n+ source region 2401 has a junction depth along the sidewalls of the trenched source-body contact structure 2402 greater than along the adjacent channel region at a same distance from the top surface of the N epitaxial layer 2404.

Figure 25:
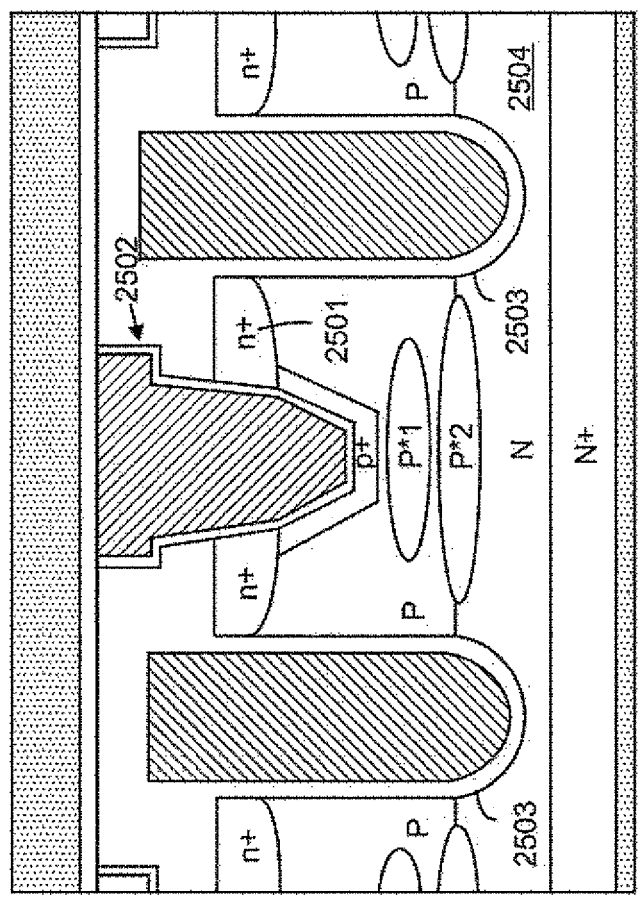
FIG. 25 is a side cross-sectional view of another preferred embodiment according to the present invention.

Please refer to FIG. 25 for a cross sectional-view of another preferred N-channel trench MOSFET which is similar to that in FIG. 13 except that, the n+ source region 2501 has a doping concentration along sidewalls of the trenched source-body contact structure 2502 higher than along an adjacent channel region near the gate trenches 2503 at a same distance from the top surface of the N epitaxial layer 2504, and the n+ source region 2501 has a junction depth along the sidewalls of the trenched source-body contact structure 2502 greater than along the adjacent channel region at a same distance from the top surface of the N epitaxial layer 2504.

Figure 26A:
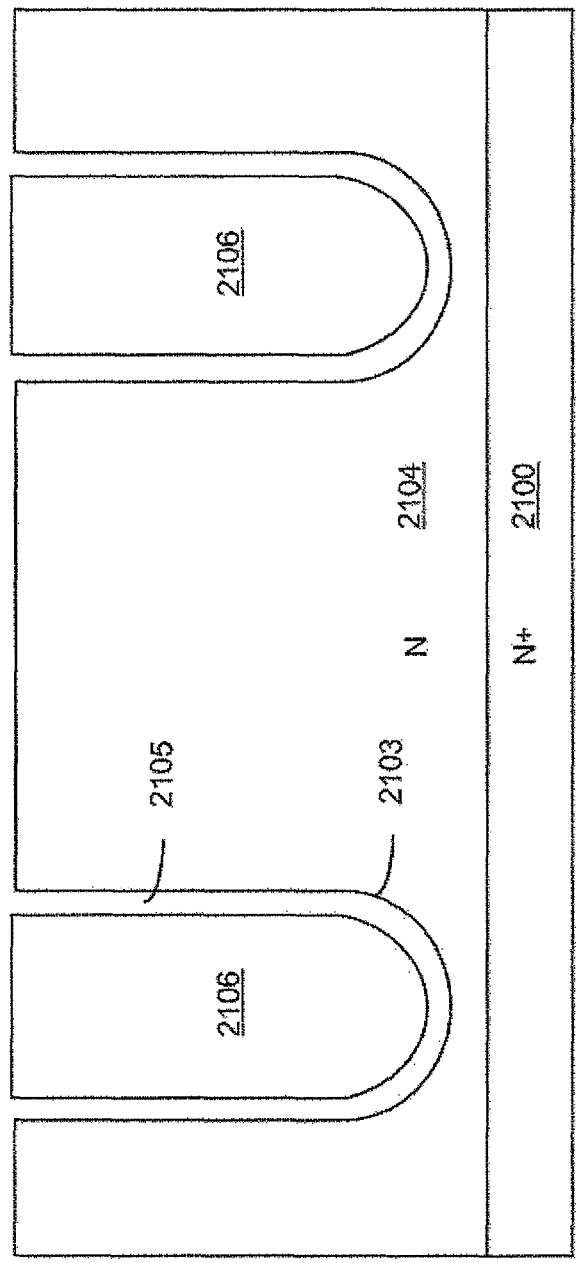
FIGS. 26A~26E are a serial of side cross-sectional views for showing the processing steps for fabricating the trench MOSFET as shown in FIG. 21.

FIGS. 26A to 26E are a serial of exemplary steps that are performed to form the preferred N-channel trench MOSFET in FIG. 21. In FIG. 26A, an N epitaxial layer 2104 is first grown on an N+ substrate 2100. After applying a trench mask (not shown), a plurality of gate trenches 2103 are trenched to a certain depth into the N epitaxial layer 2104. Then, a sacrificial oxide layer (not shown) is grown and then removed to eliminate the plasma damage may introduced during etching process. Next, an oxide layer is grown overlying inner surface of the gate trenches 2103 to serve as a gate oxide 2105, onto which a doped poly-silicon layer is deposited so that the doped poly-silicon layer 2106 overflows onto top surface of the epitaxial layer 2104. Then, the doped poly-silicon layer is etched by CMP (Chemical Mechanical Polishing) or plasma etching back to be removed away from the top surface of the N epitaxial layer 2104 to form a plurality of trenched gates 2106.

Figure 26B:
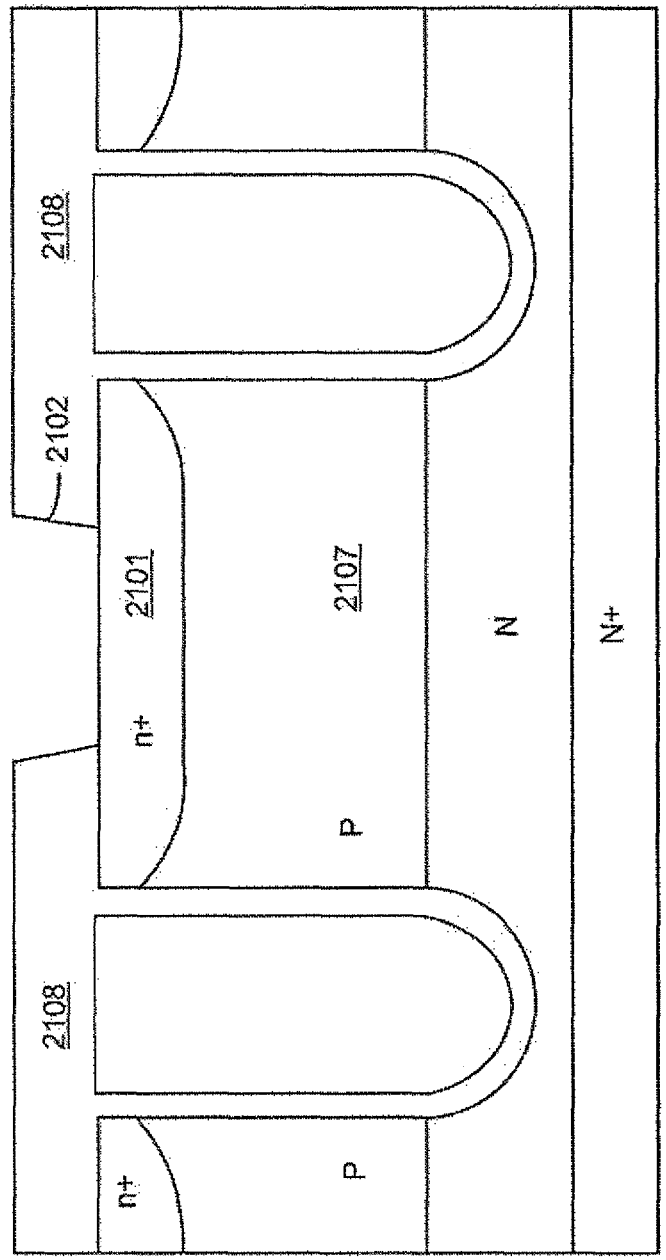

In FIG. 26B, a P body mask (not shown) is optionally used for the following P type dose implantation, then, the step of P type dose diffusion is performed to form P body regions 2107. After that, another insulation layer is deposited onto top surface of the N epitaxial layer 2104 and the trenched gates 2106 to serve as a contact insulation layer 2108. A contact mask (not shown) is applied onto the contact insulation layer 2108, and a contact opening 2102 is formed by performing a dry oxide etch process above between every two adjacent of the trenched gates 2106, then a step of n+ type dose is implanted for the formation of n+ source regions 2101 followed by diffusion. Therefore, a mask for forming source regions is saved.

Figure 26C:
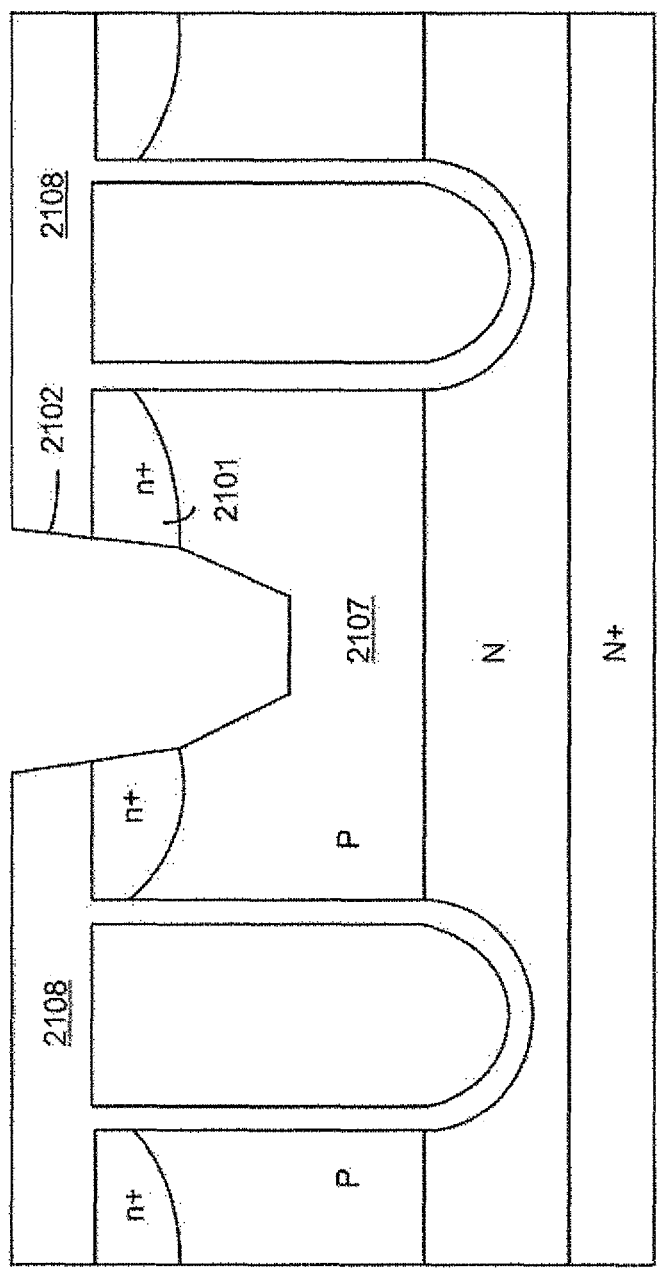

In FIG. 26C, a dry silicon etch is carried out and the contact opening 2102 is further etched through the n+ source region 2101 and etching into the P body region 2107 with slope sidewalls.

Figure 26D:
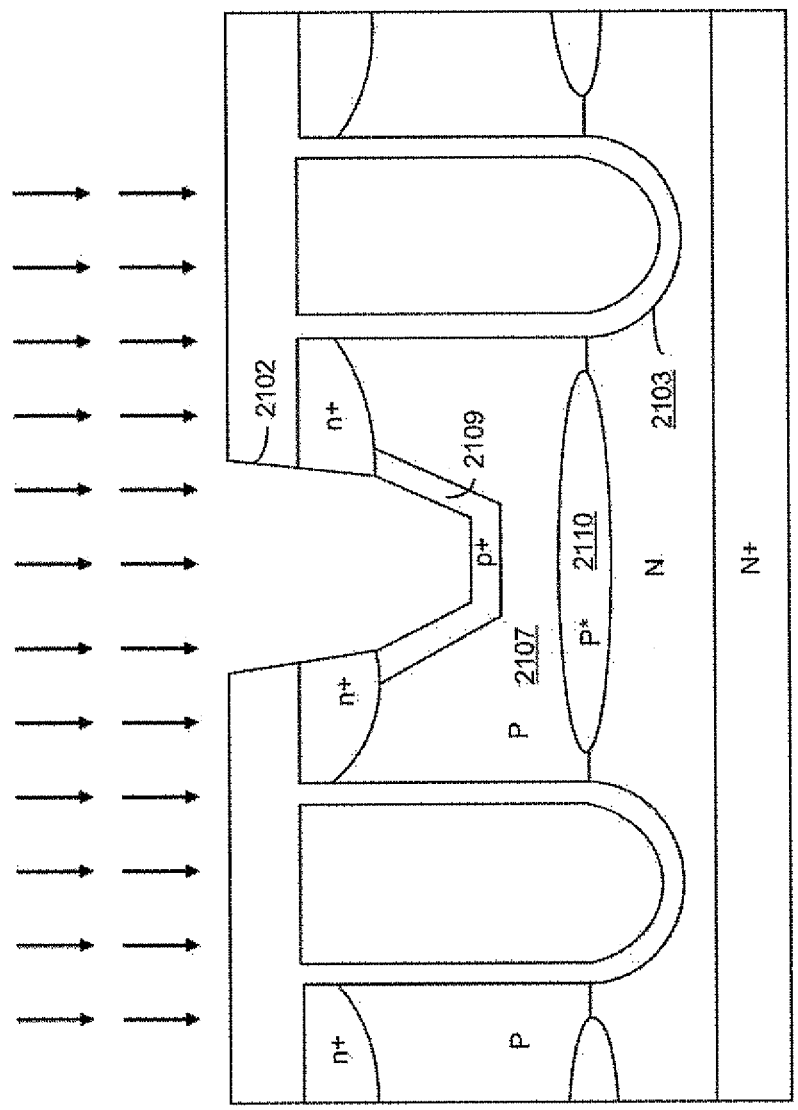

In FIG. 26D, after removing the contact mask, a BF2 ion implantation is carried out to form a p+ body ohmic contact doped region 2109 underneath the contact opening 2102 and wrapping its bottom as well as its sidewalls encompassed in the P body region 2107. Then, a Boron ion implantation is carried out with dose from $1E12\ cm^{-2}$ to $1E14\ cm^{-2}$ and with energy ranging from 100 KeV to 300 KeV to form a P* avalanche capability enhancement doped region 2110 underneath the p+ body ohmic contact doped region 2109 and not touching with channel regions near the gate trenches 2103.

Figure 26E:
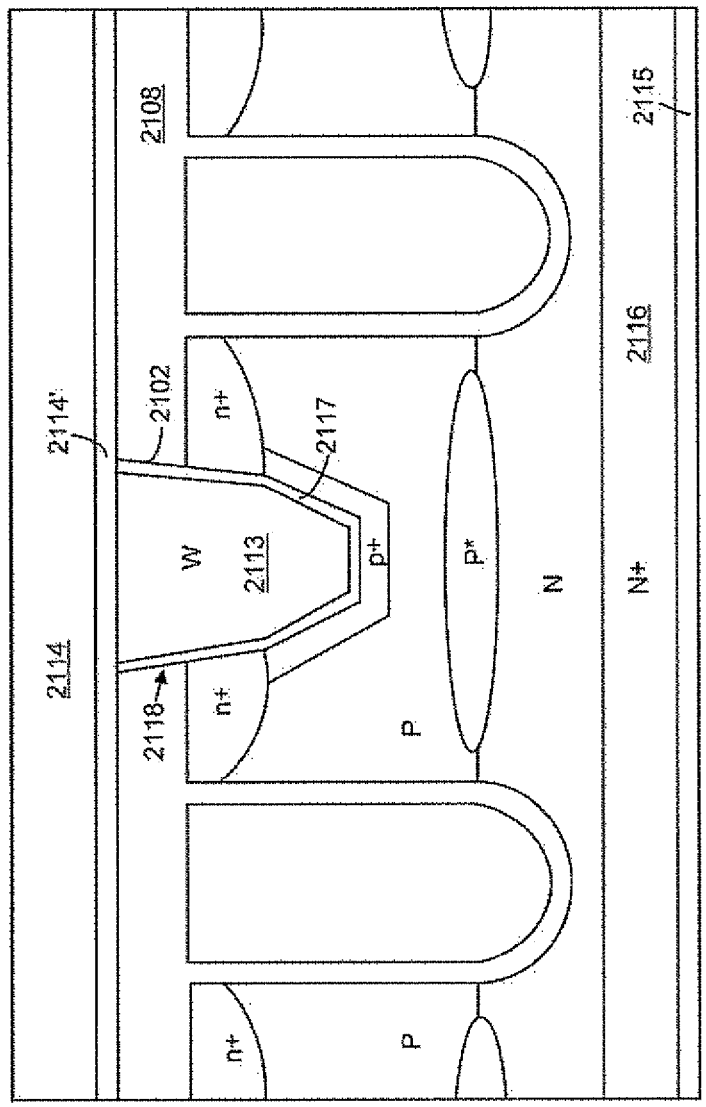

In FIG. 26E, after activating the implanted dopant in FIG. 26D, a barrier layer 2117 of Ti/TiN or Co/TiN or Ta/TiN is deposited along inner surface of the contact opening 2102, onto which, tungsten material is deposited and then etched back to be a W plug 2113 for formation of a trenched source-body contact structure 2118. Next, a front metal layer of Al alloys or Cu alloys is deposited padded by a resistance-reduction layer 2114' Ti or Ti/TiN and over the contact insulation layer 2108 as well as the trenched source-body contact structure 2118 to serve as a source metal 2114. Last, after backside grinding, drain metal 2115 of Ti/Ni/Ag is deposited onto back surface of the N+ substrate 2116.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A power semiconductor device comprising a plurality of trench MOSFETs with each comprising:
    a substrate of a first conductivity doping type;
    an epitaxial layer of said first conductivity type over said substrate, wherein said epitaxial layer having a lower doping concentration than said substrate;
    a plurality of trenched gates comprising a doped poly-silicon layer padded by a gate oxide layer filling into a plurality of gate trenches;
    a body region of a second conductivity type surrounding sidewall of each of said gate trenches between every two adjacent of said trenched gates;
    a source region of said first conductivity type near top surface of said body region, wherein said source region surrounds top portion of sidewall of each of said gate trenches, and has a higher doping concentration than said epitaxial layer;
    a contact insulation layer disposed over said epitaxial layer and covering outer surface of said trenched gates;
    a trenched source-body contact structure comprising a metal plug padded by a barrier layer filling into a contact opening, locating between every two adjacent of said trenched gates, penetrating through said contact insulation layer and said source region, and extended into said body region;
    a body ohmic contact doped region of said second conductivity type formed within said body region, surrounding at least bottom of said trenched source-body contact structure and having a higher doping concentration than said body region;
    at least two avalanche capability enhancement doped regions of said second conductivity type disposed underneath said body ohmic contact doped region, wherein among said at least two avalanche capability enhancement doped region, the bottom one is formed partially overlap with said body region and partially extending into said epitaxial layer but shallower than said gate trenches while the else being formed within said body region, wherein said at least two avalanche capability enhancement doped region have a higher doping concentration than said body region but a lower doping concentration than said body ohmic contact doped region;
    a source metal disposed covering top surface of said contact insulation layer;
    a drain metal disposed on back surface of said substrate; and
    said source region having a doping concentration along sidewalls of said trenched source-body contact structure higher than along an adjacent channel region near said gate trenches at a same distance from a top surface of said epitaxial layer, and said source region having a junction depth along the sidewalls of said trenched source-body contact structure greater than along said adjacent channel region from the top surface of said epitaxial layer.

2. The power semiconductor device of claim 1, wherein said trenched gates protrude out from said gate trenches and top surface of said trenched gates is higher than sidewall of said gate trenches.

3. The power semiconductor device of claim 1, wherein top surface of said trenched gates is not higher than sidewall of said gate trenches.

4. The power semiconductor device of claim 1, wherein said metal plug is tungsten plug padded by said barrier layer of Ti/TiN or Co/TIN or Ta/TiN.

5. The power semiconductor device of claim 1, wherein said source metal is Cu alloys or Al alloys padded by a resistance-reduction layer of Ti or Ti/TiN which covering the top surface of said contact insulation layer and said trenched source-body contact structure.

6. The power semiconductor device of claim 1, wherein said metal plug is said source metal directly filling into said contact opening.

7. The power semiconductor device of claim 6, wherein said source metal is Cu alloys or Al alloys padded by said barrier layer of Ti/TiN or Co/TIN or Ta/TiN.

8. The power semiconductor device of claim 1, wherein said drain metal is Ti/Ni/Ag.

9. The power semiconductor device of claim 1, wherein said drain metal is Ti/Ni/Ag.

10. A power semiconductor device comprising a plurality of trench MOSFETs with each comprising:
a substrate of a first conductivity doping type;
an epitaxial layer of said first conductivity type over said substrate, wherein said epitaxial layer having a lower doping concentration than said substrate;
a plurality of trenched gates comprising a doped polysilicon layer padded by a gate oxide layer filling into a plurality of gate trenches;
a body region of a second conductivity type surrounding sidewall of each of said gate trenches between every two adjacent of said trenched gates;
a source region of said first conductivity type near top surface of said body region, wherein said source region surrounds top portion of sidewall of each of said gate trenches, and has a higher doping concentration than said epitaxial layer;
a contact insulation layer disposed over said epitaxial layer and covering outer surface of said trenched gates;
a trenched source-body contact structure comprising a metal plug padded by a barrier layer filling into a contact opening, locating between every two adjacent of said trenched gates, penetrating through said contact insulation layer and said source region, and extended into said body region;
a body ohmic contact doped region of said second conductivity type formed within said body region, surrounding at least bottom of said trenched source-body contact structure and having a higher doping concentration than said body region;
an avalanche capability enhancement doped region of said second conductivity type disposed underneath said body ohmic contact doped region, wherein said avalanche capability enhancement doped region is formed partially overlap with said body region and partially extending into said epitaxial layer but shallower than said gate trenches, wherein said at least one avalanche capability enhancement doped region has a higher doping concentration than said body region but a lower doping concentration than said body ohmic contact doped region;
a source metal disposed covering top surface of said contact insulation layer;
a drain metal disposed on back surface of said substrate; and
said source region having a doping concentration along sidewalls of said trenched source-body contact structure higher than along an adjacent channel region near said gate trenches at a same distance from a top surface of said epitaxial layer, and said source region having a junction depth along the sidewalls of said trenched source-body contact structure greater than along said adjacent channel region from the top surface of said epitaxial layer.

11. The power semiconductor device of claim 10, wherein said trenched gates protrude out from said gate trenches and top surface of said trenched gates is higher than sidewall of said gate trenches.

12. The power semiconductor device of claim 10, wherein top surface of said trenched gates is not higher than sidewall of said gate trenches.

13. The power semiconductor device of claim 10, wherein said metal plug is tungsten plug padded by said barrier layer of Ti/TiN or Co/TiN or Ta/TiN.

14. The power semiconductor device of claim 10, wherein said source metal is Cu alloys or Al alloys padded by a resistance-reduction layer of Ti or Ti/TIN which covering the top surface of said contact insulation layer and said trenched source-body contact structure.

15. The power semiconductor device of claim 10, wherein said metal plug is said source metal directly filling into said contact opening.

16. The power semiconductor device of claim 15, wherein said source metal is Cu alloys or Al alloys padded by said barrier layer of Ti/TiN or Co/TiN or Ta/TiN.

* * * * *